United States Patent
Kang

(10) Patent No.: US 10,988,372 B2
(45) Date of Patent: Apr. 27, 2021

(54) MEMS DEVICE WITH REDUCED ELECTRIC CHARGE, CAVITY VOLUME AND STICTION

(71) Applicant: InvenSense, Inc., San Jose, CA (US)

(72) Inventor: Dongyang Kang, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 145 days.

(21) Appl. No.: 16/660,655

(22) Filed: Oct. 22, 2019

(65) Prior Publication Data

US 2021/0070608 A1 Mar. 11, 2021

Related U.S. Application Data

(60) Provisional application No. 62/773,072, filed on Nov. 29, 2018.

(51) Int. Cl.
- *B81B 7/00* (2006.01)
- *B81B 3/00* (2006.01)
- *B81C 1/00* (2006.01)

(52) U.S. Cl.
CPC ........ *B81B 3/0008* (2013.01); *B81C 1/00269* (2013.01); *B81C 1/00388* (2013.01); *B81C 1/00968* (2013.01); *B81C 2201/014* (2013.01); *B81C 2203/036* (2013.01)

(58) Field of Classification Search
CPC .............. B81C 3/0008; B81C 1/00968; B81C 2203/036; B81C 2201/014; B81C 1/00238; B81C 2201/019
See application file for complete search history.

(56) References Cited

U.S. PATENT DOCUMENTS

| | | | |
|---|---|---|---|
| 8,350,346 B1 | 1/2013 | Le | |
| 9,212,051 B1* | 12/2015 | Monadgemi | B81C 1/00285 |
| 9,714,165 B1* | 7/2017 | Hrudey | B81C 1/00182 |
| 2015/0035089 A1* | 2/2015 | Liu | B81B 7/02 |
| | | | 257/415 |
| 2015/0162205 A1* | 6/2015 | Wu | H01L 21/76816 |
| | | | 438/618 |
| 2015/0307346 A1* | 10/2015 | Cheng | B81C 3/001 |
| | | | 257/417 |
| 2015/0375995 A1* | 12/2015 | Steimle | B81C 1/00238 |
| | | | 257/418 |
| 2016/0159643 A1* | 6/2016 | Chu | B81B 7/02 |
| | | | 257/419 |
| 2017/0040179 A1* | 2/2017 | Liao | H01L 21/283 |
| 2018/0305201 A1* | 10/2018 | Chu | B81B 7/02 |
| 2018/0327254 A1* | 11/2018 | Cheng | B81C 1/00301 |
| 2019/0035905 A1* | 1/2019 | Kim | B81B 7/00 |
| 2019/0382264 A1* | 12/2019 | Yu | B81C 3/001 |

* cited by examiner

*Primary Examiner* — Ahmed N Sefer

(57) ABSTRACT

A method includes forming a first mask on a first portion of a first surface of a substrate, forming a second mask on the first mask and further forming the second mask on a second portion of the first surface of the substrate, and etching an exposed portion of the first surface of the substrate and removing the second mask. According to some embodiments, an exposed portion of the first surface of the substrate is etched and the first mask is removed. An oxide layer is formed on the first surface of the substrate. A third mask is formed on the oxide layer except for a portion of the oxide layer corresponding to bumpstop features. The portion of the oxide layer corresponding to the bumpstop features is removed. An exposed portion of the first surface of the substrate is etched and the third mask is removed.

12 Claims, 14 Drawing Sheets

MEMS DEVICE WITH REDUCED ELECTRIC CHARGE, CAVITY VOLUME AND STICTION

CROSS-REFERENCE TO RELATED APPLICATIONS

This application claims the benefit and priority to the U.S. Provisional Patent Application Ser. No. 62/773,072 filed Nov. 29, 2018, entitled "Selective Removal of MEMS UCAV Oxide."

BACKGROUND

MEMS ("micro-electro-mechanical systems") are a class of devices that are fabricated using semiconductor-like processes and exhibit mechanical characteristics. For example, MEMS devices may include the ability to move or deform. In many cases, but not always, MEMS interact with electrical signals. A MEMS device may refer to a semiconductor device that is implemented as a micro-electro-mechanical system. A MEMS device includes mechanical elements and may optionally include electronics (e.g. electronics for sensing). MEMS devices include but are not limited to, for example, gyroscopes, accelerometers, magnetometers, pressure sensors, etc. Unfortunately, electrostatic charges may form from contact between two components with different materials, e.g., proof mass and Upper Cavity (UCAV) oxide layer. The electrostatic charge may cause an offset and therefore results in performance degradation. Some have increased the distance between the two components in order to eliminate contact therefore reduce electrostatic charges. Unfortunately increasing the distance results in an increased cavity volume, which adversely impacts performance for accelerometers.

SUMMARY

Accordingly, a need has arisen to reduce the amount of electrostatic charges formed on a proof mass of a sensor without increasing the cavity volume. In some embodiments, a method includes forming a first mask on a first portion of a first surface of a substrate. The method further includes forming a second mask on the first mask and further forming the second mask on a second portion of the first surface of the substrate. The method in some embodiments includes etching an exposed portion of the first surface of the substrate and removing the second mask. According to some embodiments, the method further includes etching an exposed portion of the first surface of the substrate and removing the first mask. In one illustrative embodiment, the method further includes forming an oxide layer on the first surface of the substrate. In some embodiments, a third mask is formed on the oxide layer except for a portion of the oxide layer corresponding to bumpstop features. It is appreciated that the portion of the oxide layer corresponding to the bumpstop features is removed. An exposed portion of the first surface of the substrate is etched and the third mask is removed.

In some embodiments, the method further includes fusion bonding a silicon wafer to a third portion of the first surface of the substrate that is covered by the oxide layer. According to some embodiments, the method further includes etching the silicon wafer to form an actuator. It is appreciated that the first mask, the second mask and the third mask is each an oxide hard mask, a nitride hard mask, a metal hard mask, or a photoresist mask. It is further appreciated that the substrate is a silicon handle wafer or a silicon-germanium wafer.

In some illustrative embodiments, a method includes forming a first mask on a first portion of a first surface of a substrate. The method further includes forming a second mask on a portion of the first mask and further forming the second mask on a second portion of the first surface of the substrate. According to some embodiments, the method further includes etching a first exposed portion of the first surface of the substrate and removing a portion of the first mask not covered by the second mask. It is appreciated that a second exposed portion of the first surface of the substrate may be etched and the second mask may be removed. The method may further include etching a third exposed portion of the first surface of the substrate and removing the first mask. In some embodiments, a third mask is formed on the first surface of the substrate except for a portion of the first surface of the substrate corresponding to bumpstop features. An exposed portion of the first surface of the substrate may be etched and the third mask may be removed. In some embodiments, an oxide layer is formed on the first surface of the substrate.

According to some embodiments, the method further includes fusion bonding a silicon wafer to a portion of the first surface of the substrate that is covered by the oxide layer. The silicon wafer may form an actuator. In some embodiments, the substrate may be a silicon wafer or a silicon-germanium wafer.

In some embodiments, the method may further include etching the oxide layer to remove the oxide layer around and on the bumpstop features using a fourth mask. In some embodiments, a silicon wafer is fusion bonded to a portion of the first surface of the substrate that is covered by the oxide layer after removing the fourth mask. It is appreciated that each of the first mask, the second mask, the third mask, and the fourth mask may be an oxide hard mask, a nitride hard mask, a metal hard mask, or a photo resist mask.

These and other features and aspects of the concepts described herein may be better understood with reference to the following drawings, description, and appended claims.

DESCRIPTION

Figure 1:
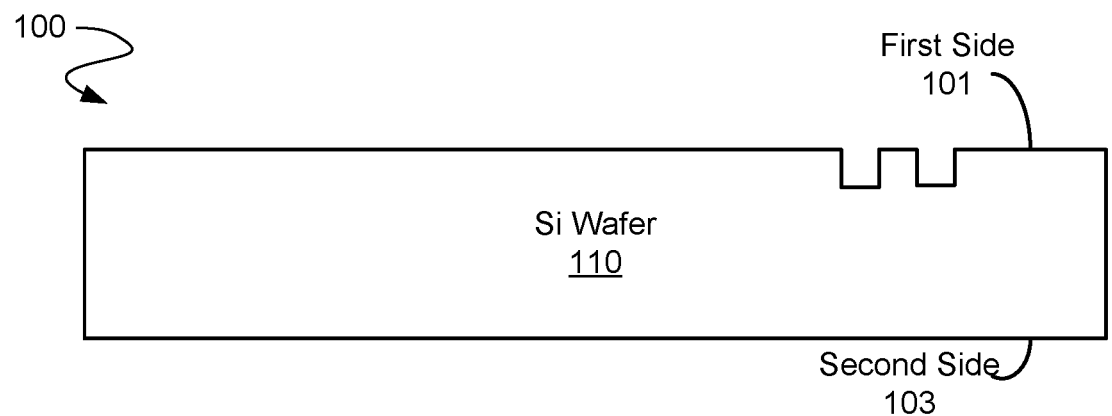
FIG. 1 shows a MEMS sensors at an early stage of manufacture according to one aspect of the present embodiments.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc. are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

A MEMS sensor includes mechanical elements and may optionally include electronics (e.g. electronics for sensing). MEMS sensors include but are not limited to, for example, gyroscopes, accelerometers, magnetometers, microphones, pressure sensors, etc. It is desirable to reduce the amount of electrostatic charges formed on a proof mass of a sensor without increasing the cavity volume in certain types of sensors, e.g., accelerometer.

Referring now to FIG. 1, a MEMS sensors at an early stage of manufacture according to one aspect of the present embodiments is shown. A handle wafer 110 (Silicon wafer) is provided. In some embodiment, the wafer 110 may be a silicon-germanium wafer. The handle wafer 110 includes a first side 101 and a second side 103. In various embodiments, the handle wafer 110 is highly doped silicon that includes a dopant density greater than or equal to ("≥") $10^{17}$ atoms per $cm^3$. As such, the highly doped silicon of the handle wafer 110 is electrically conductive. In various embodiments, the silicon is doped with poly anneal or poly drive-in to form the highly doped silicon. It is appreciated that the first side 101 may include some trenches.

Figure 2:
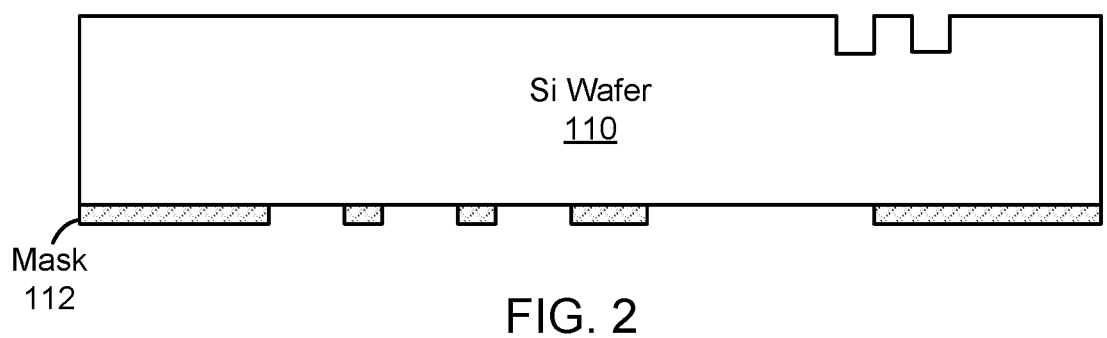
FIG. 2 shows the MEMS sensors after a first mask is formed according to one aspect of the present embodiments.

Referring now to FIG. 2, the MEMS sensors after a first mask 112 is formed according to one aspect of the present embodiments is shown. The first mask 112 is formed on the second side 103 of the wafer 110. The first mask 112 may be an oxide hard mask, a nitride hard mask, a metal hard mask, or a photoresist mask. In this illustrative embodiment, the first mask 112 is an oxide hard mask. The mask 112 is patterned. Accordingly, certain portions of the second side 103 of the wafer 110 is exposed while other portions of the second side 103 is covered by the mask 112.

Figure 3:
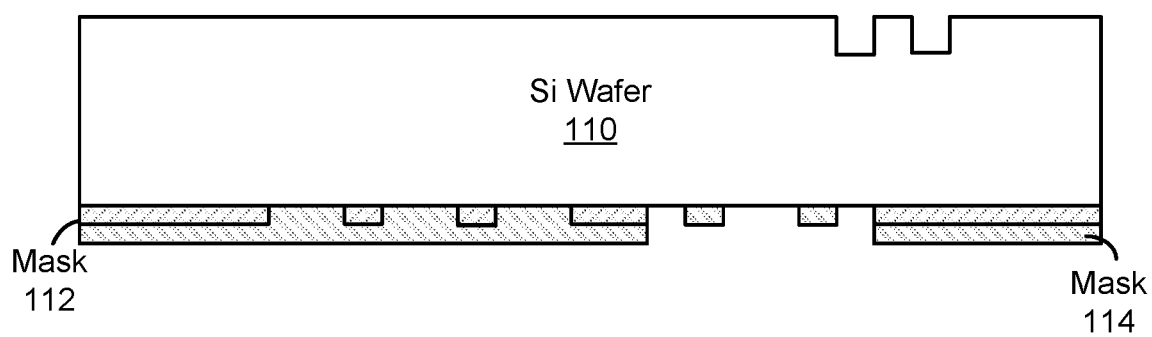
FIG. 3 shows the MEMS sensors after a second mask is formed according to one aspect of the present embodiments.

Referring now to FIG. 3, the MEMS sensors after a second mask 114 is formed according to one aspect of the present embodiments is shown. The second mask 114 is formed on the first mask 112 as well as on certain areas (portions) of the second side 103 of the wafer 110 that is exposed. It is appreciated that in the illustrative embodiment, the portion of the second side 103 that is not exposed (on the left) corresponds to a first sensor 109 (shown in FIG. 6) and the portion of the second side 103 that is exposed (on the right) corresponds to a second sensor 107 (shown in FIG. 6) of the MEMS sensors. In some embodiments, the second mask 114 may be an oxide hard mask, a nitride hard mask, a metal hard mask, or a photoresist mask. The second mask 114 may be different from the first mask 112. In this illustrative embodiment, the mask 114 is a photoresist mask.

Figure 4:
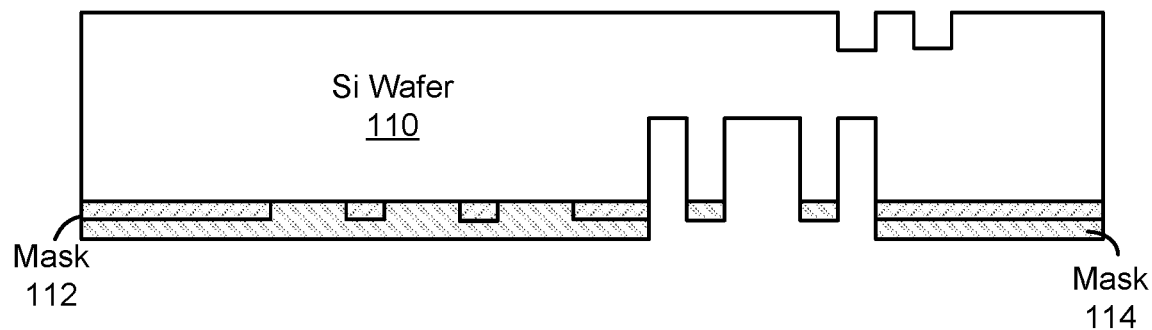
FIG. 4 shows the MEMS sensors being etched according to one aspect of the present embodiments.

Referring now to FIG. 4, the MEMS sensors being etched according to one aspect of the present embodiments is shown. It is appreciated that the exposed portion (not covered by the masks 112 and 114) of the wafer 110 on the second side 103 is etched. In other words, the second sensor 107 portion of the MEMS sensors is etched.

Figure 5:
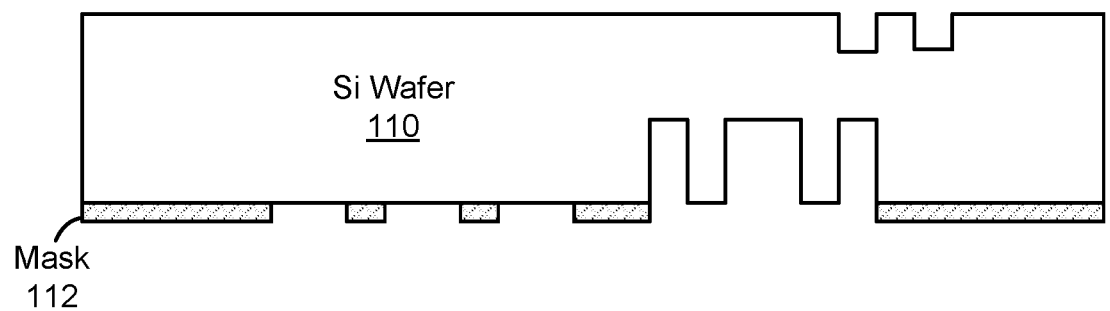
FIG. 5 shows the MEMS sensors after the second mask is removed according to one aspect of the present embodiments.

Referring now to FIG. 5, the MEMS sensors after the second mask 114 is removed according to one aspect of the present embodiments is shown. As such, a portion of the wafer 110 on the second side 103 that corresponds to the first sensor 109 portion of the MEMS sensors gets exposed.

Figure 6:
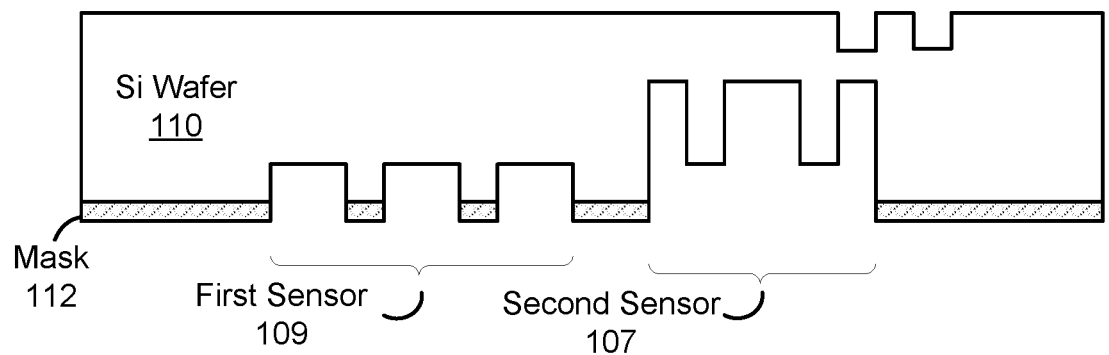
FIG. 6 shows the MEMS sensors being further etched according to one aspect of the present embodiments.

Referring now to FIG. 6, the MEMS sensors being further etched according to one aspect of the present embodiments is shown. In other words, the first sensor 109 portion on the second side 103 and the second sensor 107 portion on the second side 103 are etched.

Figure 7:
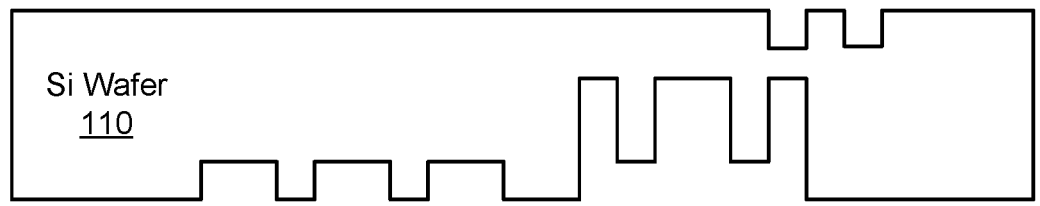
FIG. 7 shows the first mask being removed from the MEMS sensors according to one aspect of the present embodiments.
Figure 8:
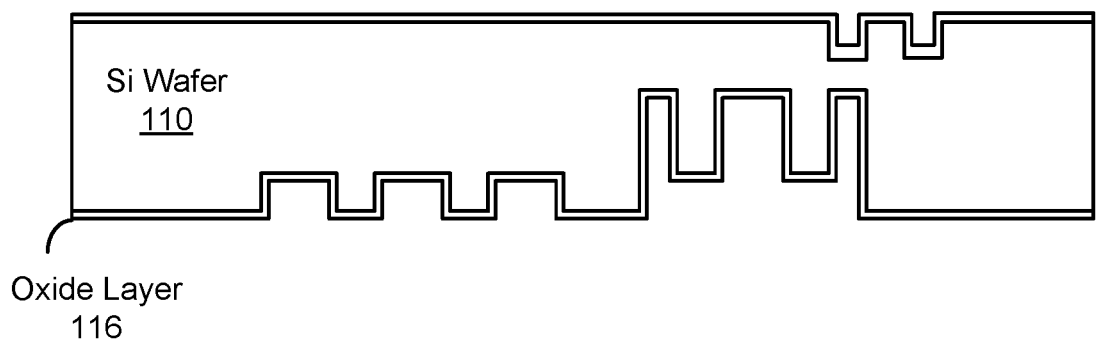
FIG. 8 shows the formation of an oxide layer on the MEMS sensors according to one aspect of the present embodiments.

Referring now to FIG. 7, the first mask 112 being removed from the MEMS sensors according to one aspect of the present embodiments is shown. Referring now to FIG. 8, the formation of an oxide layer 116 on the MEMS sensors according to one aspect of the present embodiments is shown. It is appreciated that the oxide layer 116 may be an oxide layer. In some embodiments, the oxide layer 116 is formed on the first side 101 and the second side 103 of the wafer 110.

Figure 9:
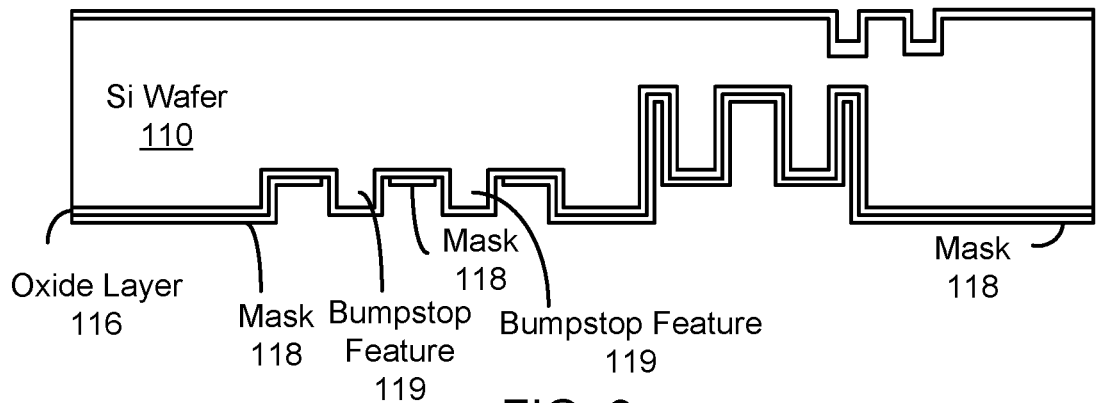
FIG. 9 shows a third mask being formed over the oxide layer of the MEMS sensors according to one aspect of the present embodiments.

Referring now to FIG. 9, a third mask 118 being formed over the oxide layer 116 of the MEMS sensors according to one aspect of the present embodiments is shown. The mask 118 is formed over the second sensor 107 portion and it is further formed selectively over the first sensor 109 portion of the MEMS sensor, leaving the oxide layer 116 on the bumpstop features 119 exposed. The mask 118 may be an oxide hard mask, a nitride hard mask, a metal hard mask, or a photoresist mask. In this illustrative embodiment, the mask 118 is photoresist mask.

Figure 10:
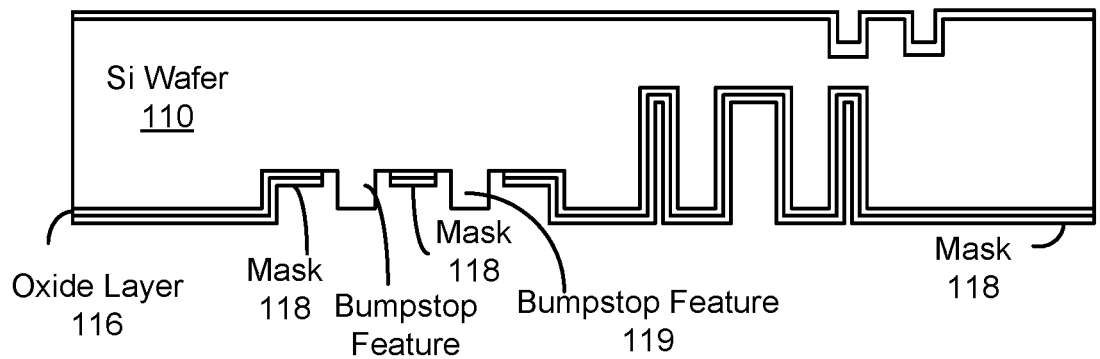
FIG. 10 shows an exposed portion of the oxide layer being removed according to one aspect of the present embodiments.

Referring now to FIG. 10, an exposed portion of the oxide layer 116 being removed according to one aspect of the present embodiments is shown. Accordingly, the oxide layer 116 on the bumpstop features 119 is removed to expose the wafer 110.

Figure 11:
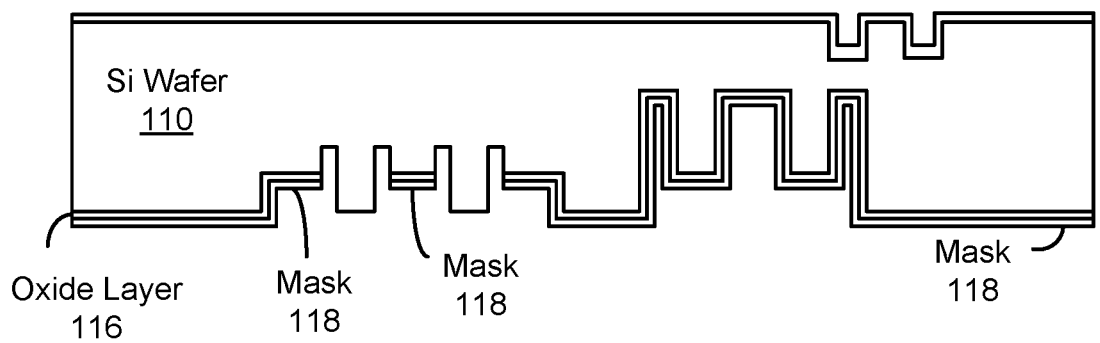
FIG. 11 shows an exposed portion of the MEMS sensors being etched according to one aspect of the present embodiments.
Figure 12:
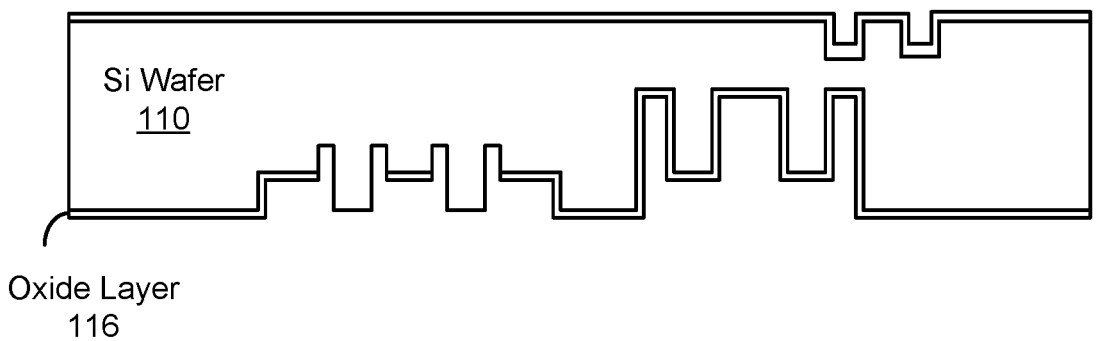
FIG. 12 shows the third mask being removed according to one aspect of the present embodiments.

Referring now to FIG. 11, an exposed portion of the MEMS sensors being etched according to one aspect of the present embodiments is shown. Accordingly, the bumpstop features 119 that are now exposed along with the exposed portion of the wafer 110 on the second side 103 are etched. Referring now to FIG. 12, the third mask 118 being removed according to one aspect of the present embodiments is shown. Accordingly, the second side 103 of the wafer 110 is covered by the oxide layer 116 but its bumpstop features 119 are exposed.

Figure 13:
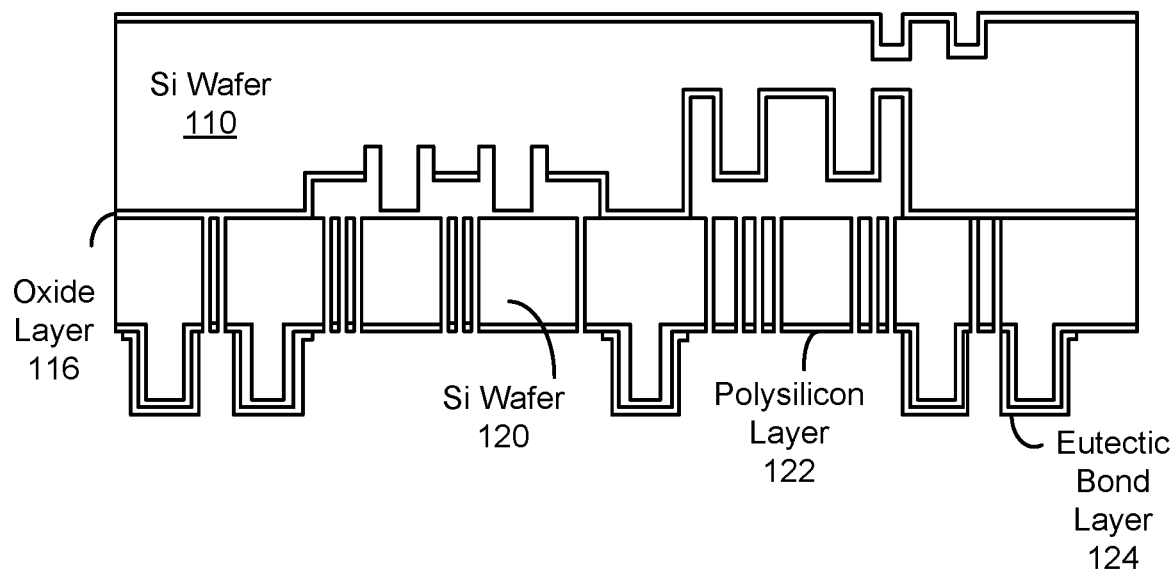
FIG. 13 shows the MEMS sensors eutectically bonding to a silicon wafer according to one aspect of the present embodiments.

Referring now to FIG. 13, the MEMS sensors fusion bonding to a silicon wafer 120 according to one aspect of the present embodiments is shown. In other words, the oxide layer 116 of the wafer 110 is fusion bonded to the wafer 120.

A polysilicon layer 122 and Ge layer 124 may be formed on a side of the wafer 120 that is opposite to the side being fusion bonded to the wafer 110. The wafer 120 may be etched to form an actuator portion of the MEMS sensors. Retaining oxide layer 116 of the second side adjacent the bumpstops 119 prevents etching of the wafer 110 during the etching of the device wafer 120. Bumpstop 119 without oxide layer not only reduces the electrostatic charge but also prevents stiction between silicon wafer 120 and silicon wafer 110.

Figure 14:
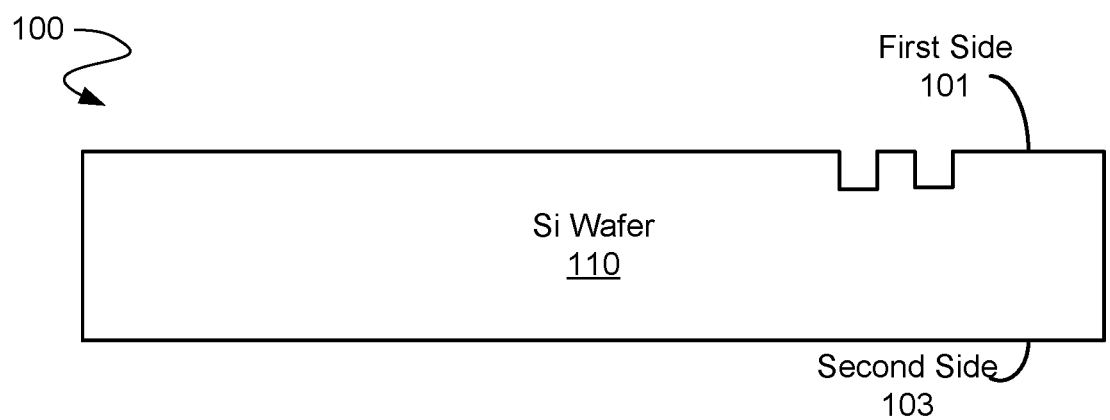
FIG. 14 shows a MEMS sensors at an early stage of manufacture according to one aspect of the present embodiments.
Figure 15:
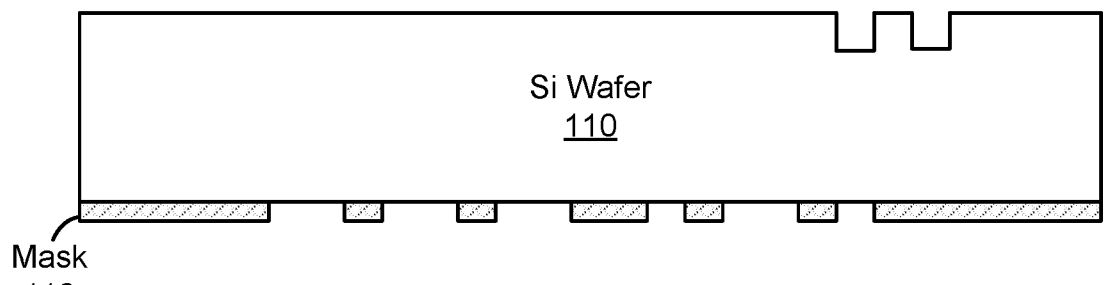
FIG. 15 shows the MEMS sensors after a first mask is formed according to one aspect of the present embodiments.

Referring now to FIG. 14, a MEMS sensors at an early stage of manufacture according to one aspect of the present embodiments is shown. FIG. 14 is substantially similar to that of FIG. 1. Referring now to FIG. 15, the MEMS sensors after a first mask is formed according to one aspect of the present embodiments is shown. FIG. 15 is substantially similar to that of FIG. 2 except that the mask 112 deposited on the second sensor 107 portion of the second side 103 is also patterned.

Figure 16:
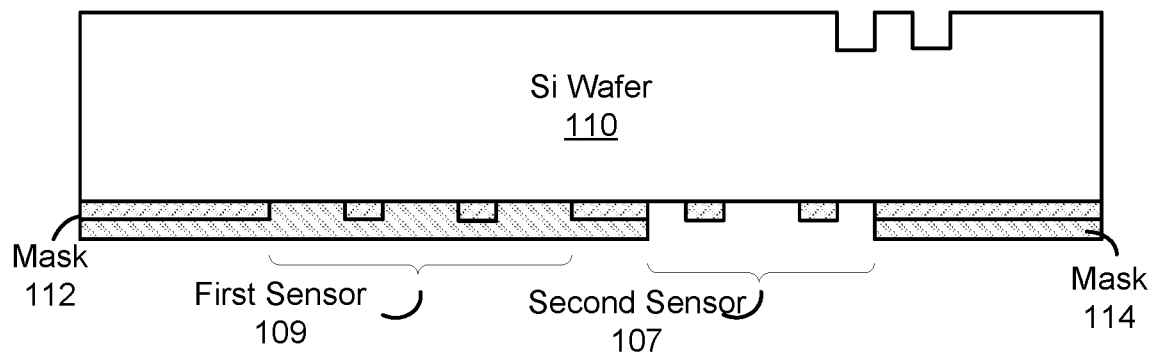
FIG. 16 shows the MEMS sensors after a second mask is formed according to one aspect of the present embodiments.

Referring now to FIG. 16, the MEMS sensors after a second mask 114 is formed according to one aspect of the present embodiments is shown. The second mask 114 is formed on the first mask 112 as well as on certain areas (portions) of the second side 103 of the wafer 110 that is exposed. It is appreciated that in the illustrative embodiment, the portion of the second side 103 that is not exposed (on the left) corresponds to the first sensor portion 109 and the portion of the second side 103 that is exposed (on the right) corresponds to the second sensor portion 107 of the MEMS sensors. In one illustrative embodiment, the mask 114 is not formed on certain portions of mask 112 on the second sensor 107 portion. In some embodiments, the second mask 114 may be an oxide hard mask, a nitride hard mask, a metal hard mask, or a photoresist mask. The second mask 114 may be different from the first mask 112. In this illustrative embodiment, the mask 114 is a photoresist mask.

Figure 17:
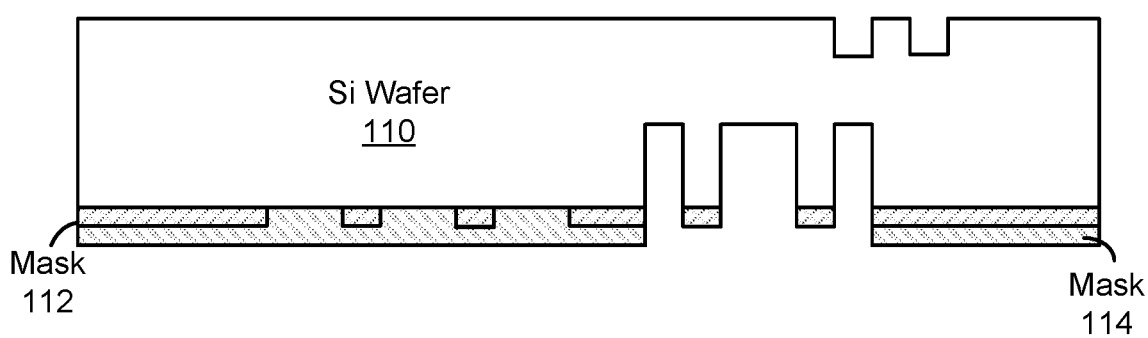
FIG. 17 shows the MEMS sensors being etched according to one aspect of the present embodiments.

Referring now to FIG. 17, the MEMS sensors being etched according to one aspect of the present embodiments is shown. FIG. 17 is substantially similar to that of FIG. 4 as described above.

Figure 18:
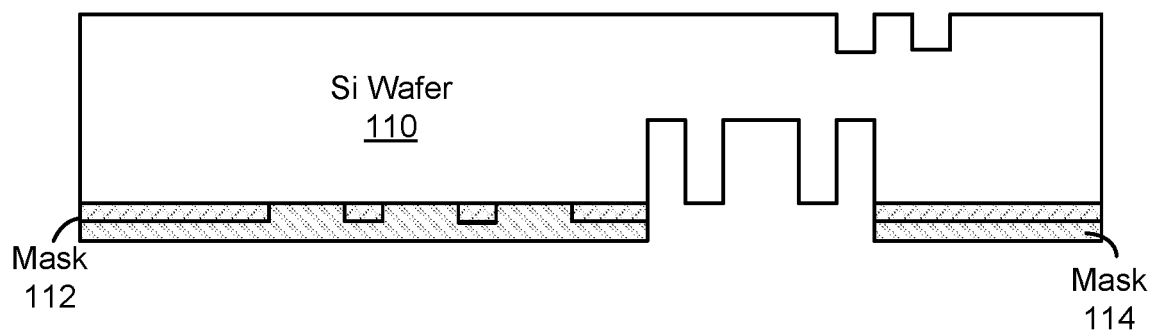
FIG. 18 shows an exposed portion of the first mask being removed according to one aspect of the present embodiments.

Referring now to FIG. 18, an exposed portion of the first mask 112 being removed according to one aspect of the present embodiments is shown. In other words, the mask 112 that is not covered by the mask 114 on the second sensor 107 side is removed.

Figure 19:
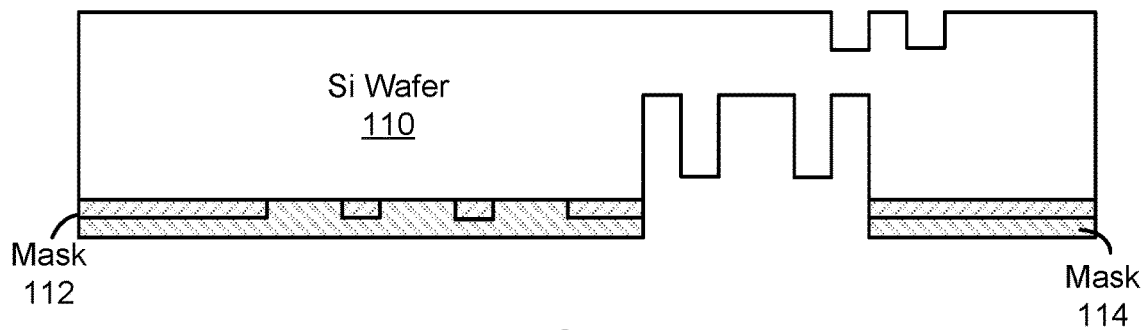
FIG. 19 shows further etching of the MEMS sensors according to one aspect of the present embodiments.

Referring now to FIG. 19, further etching of the MEMS sensors according to one aspect of the present embodiments is shown. Accordingly, the second sensor 107 side of the wafer 110 is further etched.

Figure 20:
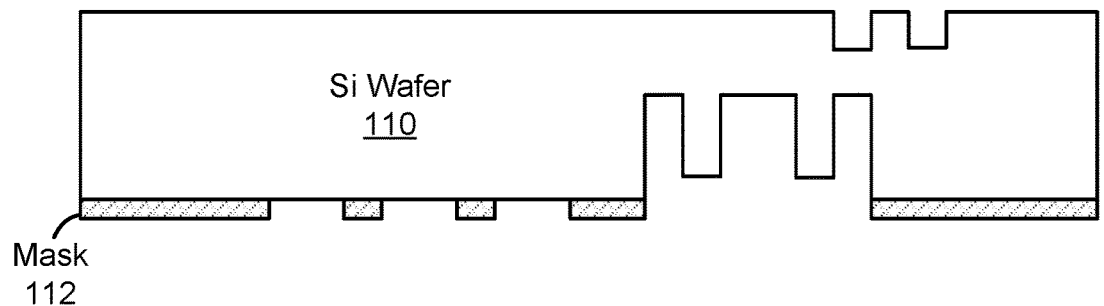
FIG. 20 shows the MEMS sensors after the second mask is removed according to one aspect of the present embodiments.
Figure 21:
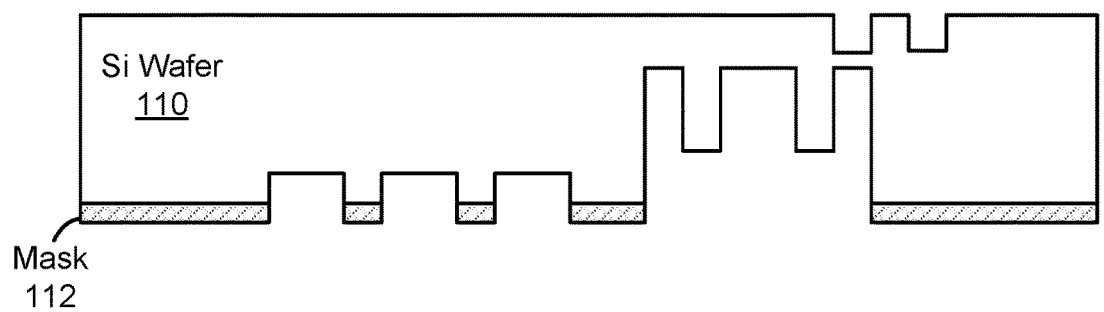
FIG. 21 shows the MEMS sensors being further etched according to one aspect of the present embodiments.

Referring now to FIG. 20, the MEMS sensors after the second mask 114 is removed according to one aspect of the present embodiments is shown. FIG. 20 is substantially similar to that of FIG. 5, as described above. Referring now to FIG. 21, the MEMS sensors being further etched according to one aspect of the present embodiments is shown. FIG. 21 is substantially similar to that of FIG. 6, as described above.

Figure 22:
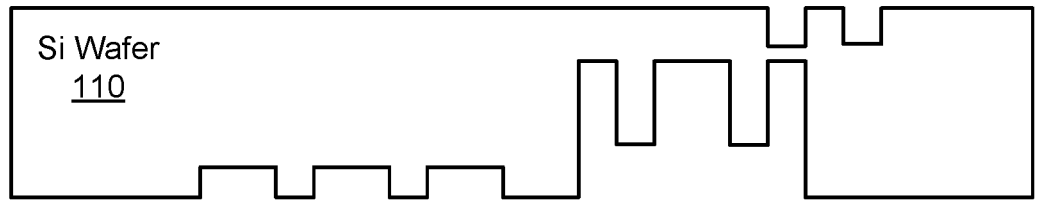
FIG. 22 shows the remainder of the first mask being removed from the MEMS sensors according to one aspect of the present embodiments.

Referring now to FIG. 22, the remainder of the first mask being removed from the MEMS sensors according to one aspect of the present embodiments is shown. FIG. 22 is substantially similar to that of FIG. 7, as described above.

Figure 23:
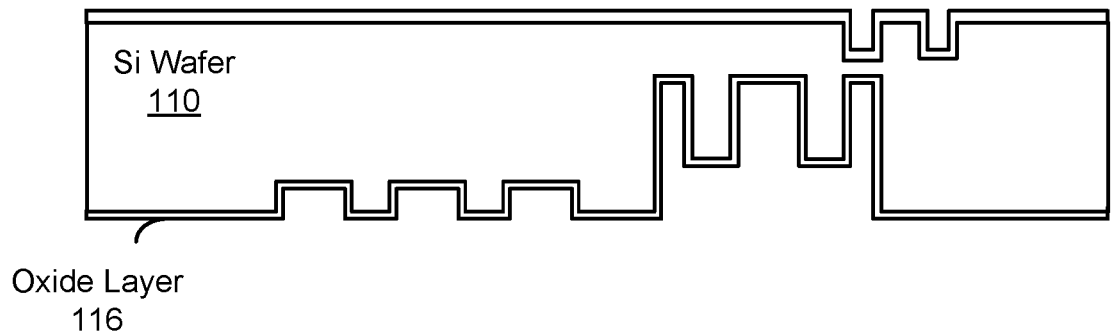
FIG. 23 shows the formation of an oxide layer on the MEMS sensors according to one aspect of the present embodiments.

Referring now to FIG. 23, the formation of an oxide layer on the MEMS sensors according to one aspect of the present embodiments is shown. FIG. 23 is substantially similar to that of FIG. 8, as described above.

Figure 24:
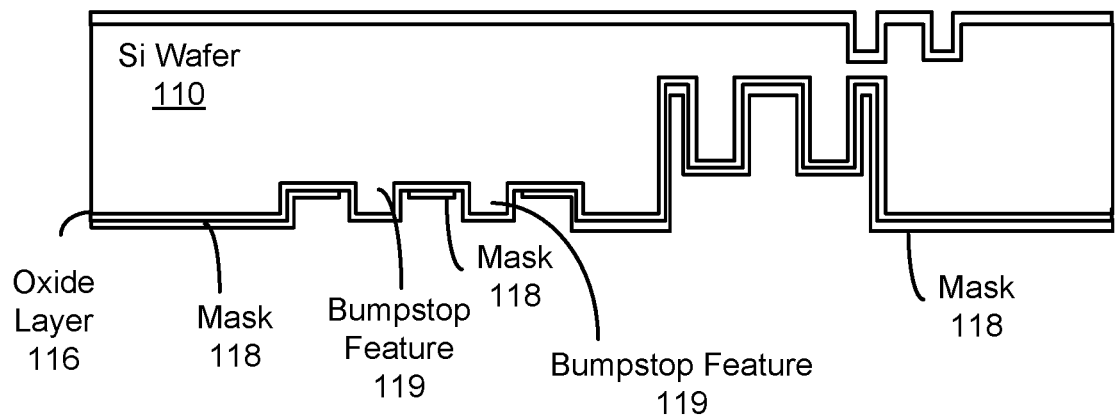
FIG. 24 shows a third mask being formed over the oxide layer of the MEMS sensors according to one aspect of the present embodiments.

Referring now to FIG. 24, a third mask being formed over the oxide layer of the MEMS sensors according to one aspect of the present embodiments is shown. FIG. 24 is substantially similar to that of FIG. 9, as described above.

Figure 25:
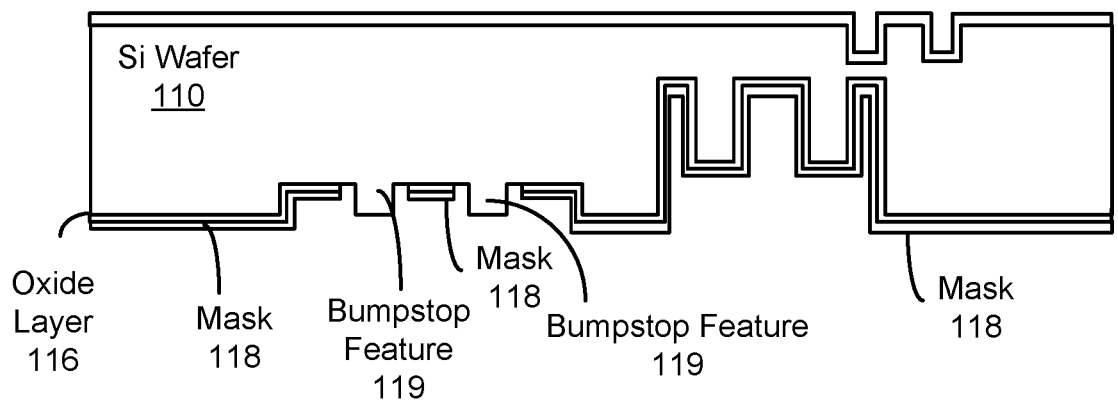
FIG. 25 shows an exposed portion of the oxide layer being removed according to one aspect of the present embodiments.

Referring now to FIG. 25, an exposed portion of the oxide layer being removed according to one aspect of the present embodiments is shown. FIG. 25 is substantially similar to that of FIG. 10, as described above.

Figure 26:
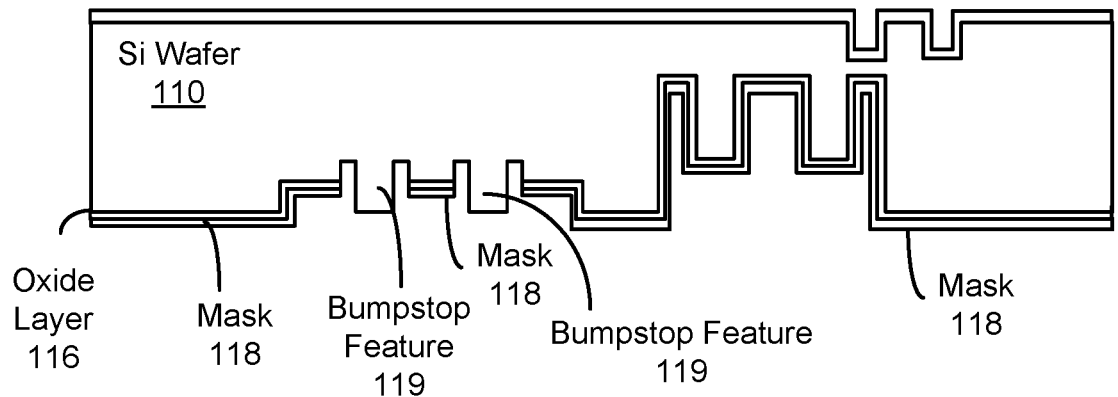
FIG. 26 shows an exposed portion of the MEMS sensors being etched according to one aspect of the present embodiments.

Referring now to FIG. 26, an exposed portion of the MEMS sensors being etched according to one aspect of the present embodiments is shown. FIG. 26 is substantially similar to that of FIG. 11, as described above.

Figure 27:
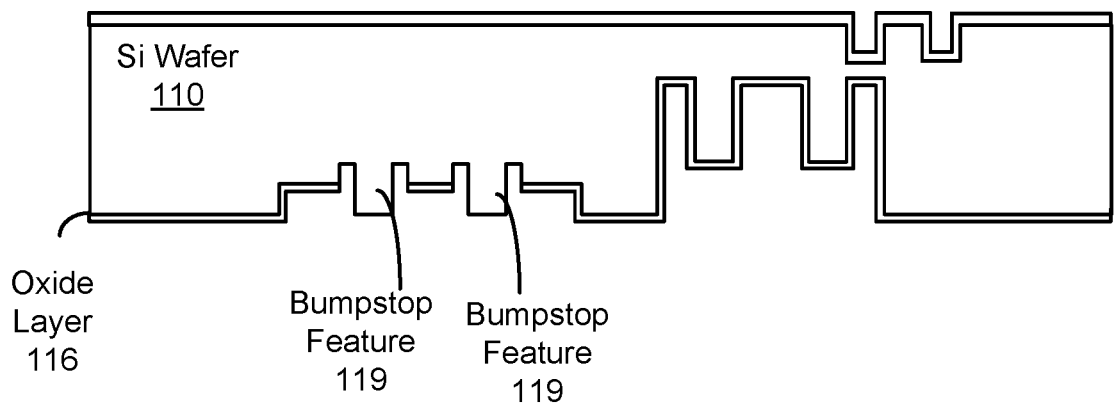
FIG. 27 shows the third mask being removed according to one aspect of the present embodiments.

Referring now to FIG. 27, the third mask being removed according to one aspect of the present embodiments is shown. FIG. 27 is substantially similar to that of FIG. 12, as described above.

Figure 28:
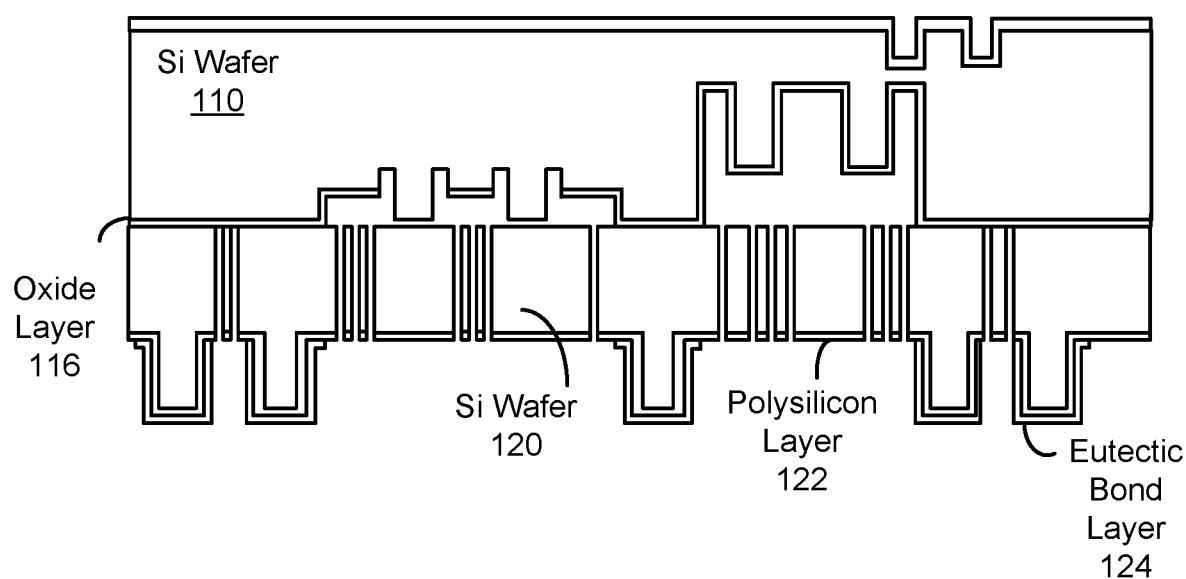
FIG. 28 shows the MEMS sensors eutectically bonding to a silicon wafer according to one aspect of the present embodiments.

Referring now to FIG. 28, the MEMS sensors eutectically bonding to a silicon wafer according to one aspect of the present embodiments is shown. FIG. 28 is substantially similar to that of FIG. 13, as described above.

Figure 29:
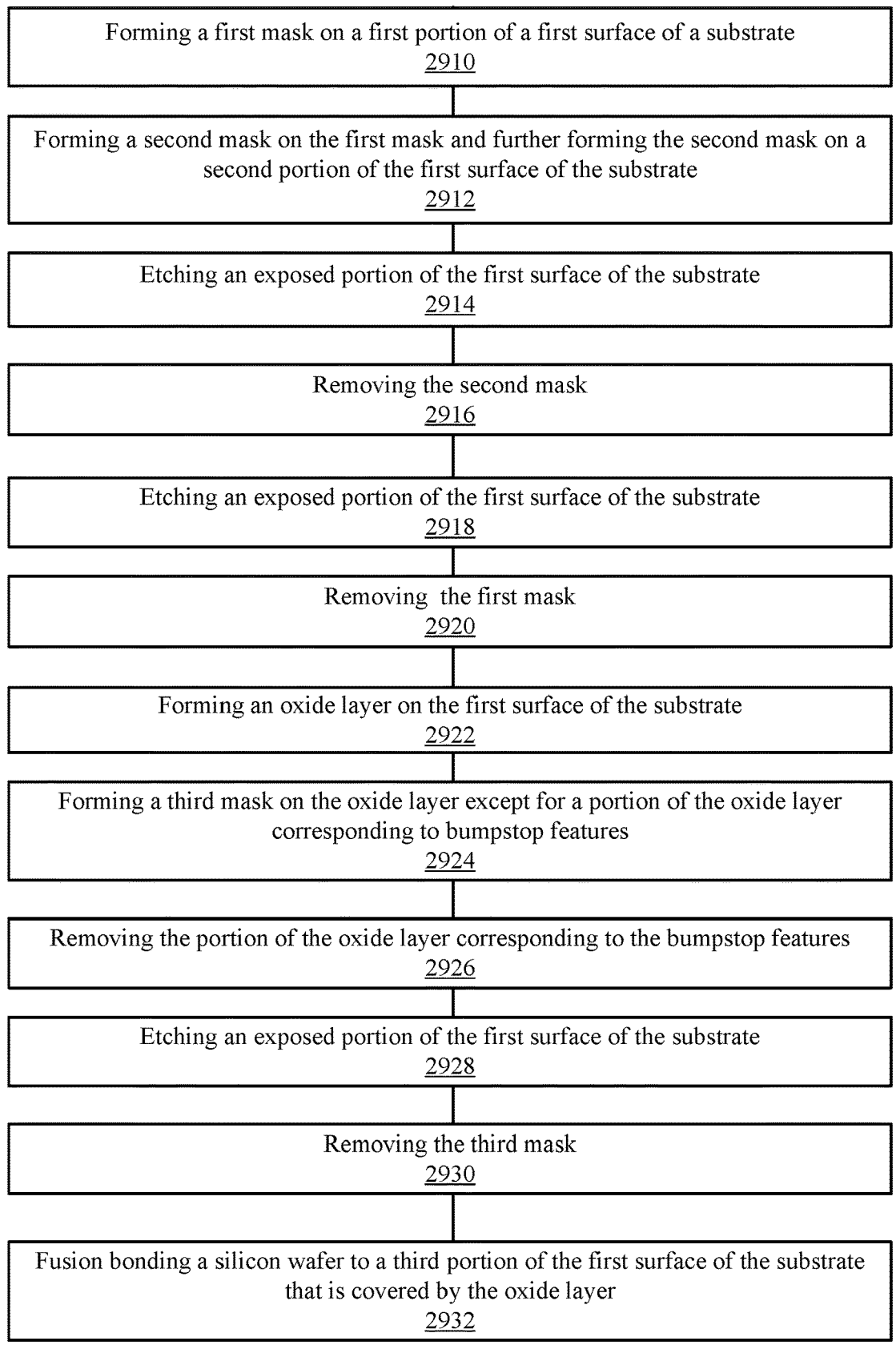
FIG. 29 shows a method of manufacturing a sensor with reduced electrostatic charge and reduced cavity volume for its first sensor according to one aspect of the present embodiments.

Referring now to FIG. 29, a method of manufacturing a sensor with reduced electrostatic charge, reduce stiction, and reduced cavity volume for its first sensor 109 according to one aspect of the present embodiments is shown. The method step described here have been described in FIGS. 1-13. At step 2910, a first mask is formed on a first portion of a first surface of a substrate. At step 2912, a second mask is formed on the first mask and further on a second portion of the first surface of the substrate. At step 2914, an exposed portion of the first surface of the substrate is etched. At step 2916, the second mask is removed. At step 2918, an exposed portion of the first surface of the substrate is etched. At step 2920, the first mask is removed. At step 2922, an oxide layer is formed on the first surface of the substrate. At step 2924, a third mask is formed on the oxide layer except for a portion of the oxide layer corresponding to bumpstop features. At step 2926, the portion of the oxide layer corresponding to the bumpstop features is removed. At step 2928, an exposed portion of the first surface of the substrate is etched. At step 2930, the third mask is removed. At step 2932, a silicon wafer is fusion bonded to a third portion of the first surface of the substrate that is covered by the oxide layer. It is appreciated that in some embodiments the silicon wafer may be etched to form an actuator.

Figure 30:
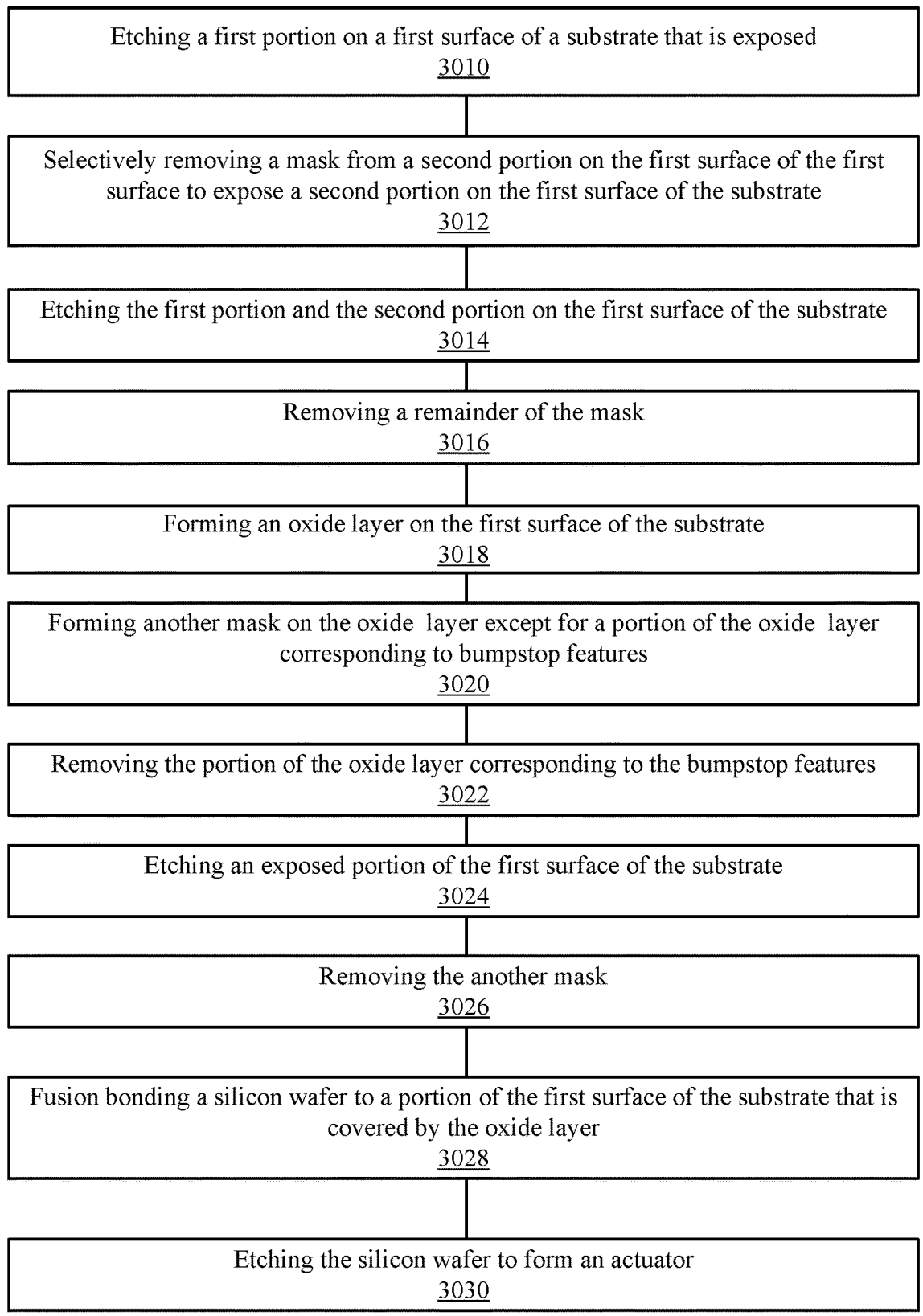
FIG. 30 shows an alternative method of manufacturing a sensor with reduced electrostatic charge and reduced cavity volume for its first sensor according to one aspect of the present embodiments.

Referring now to FIG. 30, an alternative method of manufacturing a sensor with reduced electrostatic charge, reduced stiction, and reduced cavity volume for its first sensor according to one aspect of the present embodiments is shown. The method step described here have been described in FIGS. 1-13. At step 3010, a first portion on a first surface of a substrate that is exposed is etched. At step 3012, a mask is selectively removed from a second portion on the first surface of the first surface to expose a second portion on the first surface of the substrate. At step 3014, the first portion and the second portion on the first surface of the substrate is etched. At step 3016, a remainder of the mask is removed. At step 3018, an oxide layer is formed on the first surface of the substrate. At step 3020, another mask is formed on the oxide layer except for a portion of the oxide layer corresponding to bumpstop features. At step 3022, the portion of the oxide layer corresponding to the bumpstop features is removed. At step 3024, an exposed portion of the first surface of the substrate is etched. At step 3026, the another mask is removed. At step 3028, a silicon wafer is fusion bonded to a portion of the first surface of the substrate that is covered by the oxide layer. At step 3030, the silicon wafer is etched to form an actuator.

Figure 31A:
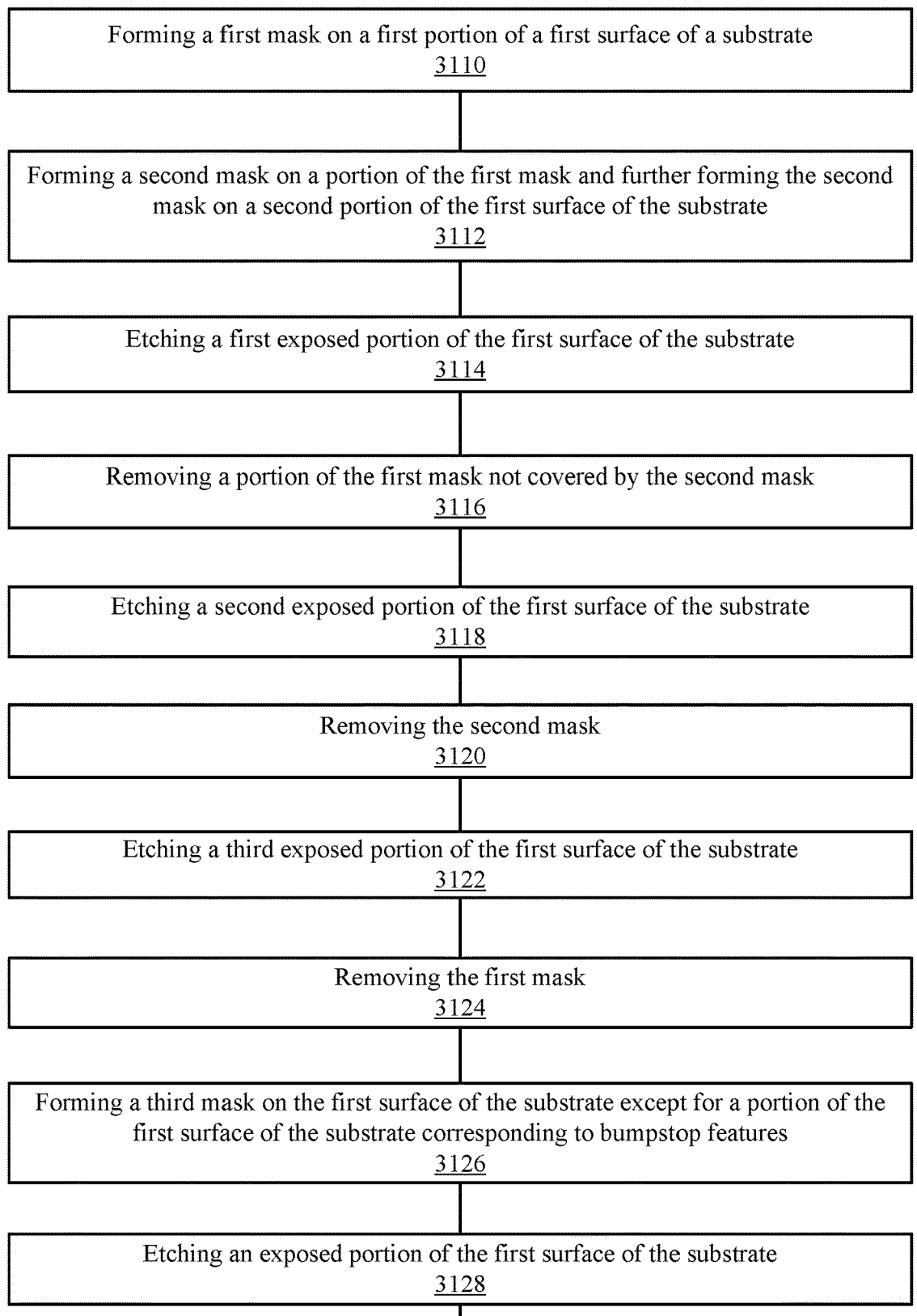
FIGS. 31A-31B show yet another method of manufacturing a sensor with reduced electrostatic charge and reduced cavity volume for its first sensor according to one aspect of the present embodiments.
Figure 31B:
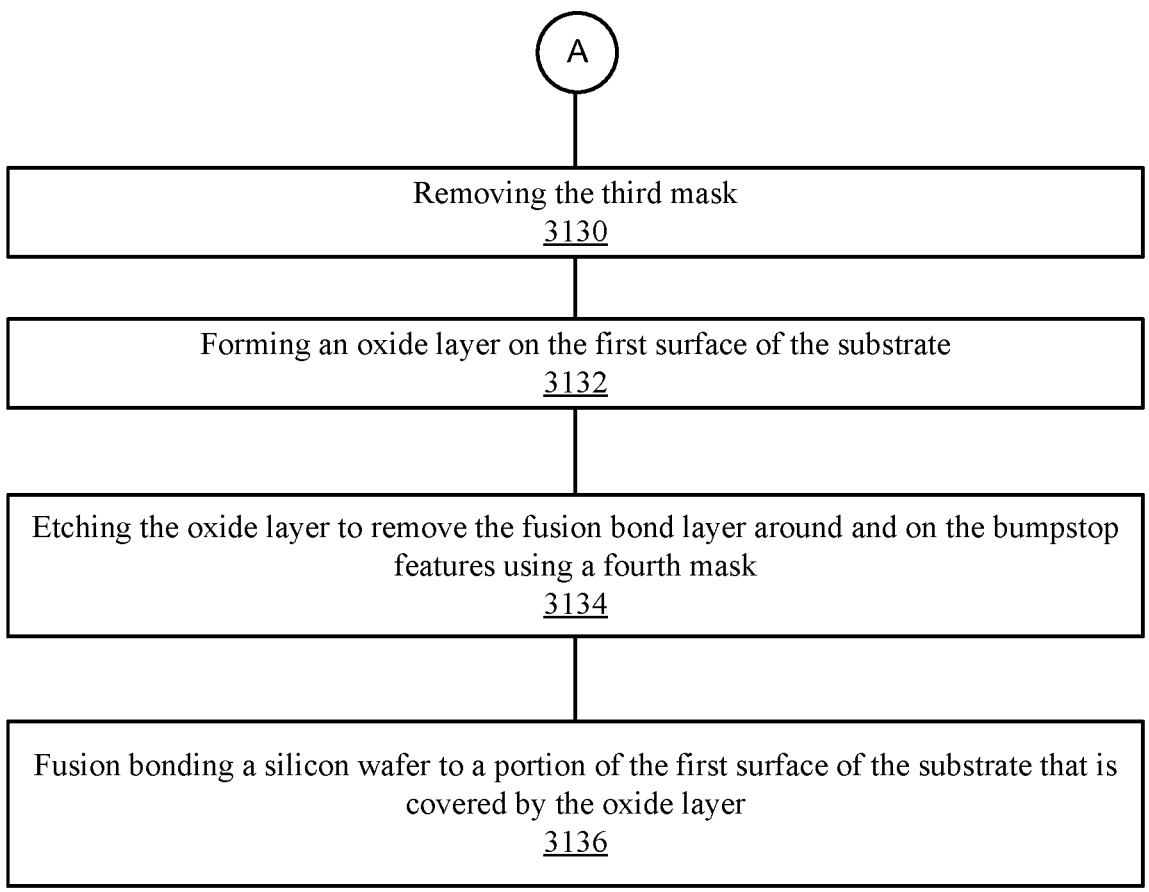

Referring now to FIGS. 31A-31B, yet another method of manufacturing a sensor with reduced electrostatic charge, reduced stiction and reduced cavity volume for its first sensor according to one aspect of the present embodiments is shown. The method step described here have been described in FIGS. 14-28. At step 3110, a first mask is formed on a first portion of a first surface of a substrate. At step 3112, a second mask is formed on a portion of the first mask and further on a second portion of the first surface of the substrate. At step 3114, a first exposed portion of the first surface of the substrate is etched. At step 3116, a portion of the first mask not covered by the second mask is removed. At step 3118, a second exposed portion of the first surface of the substrate is etched. At step 3120, the second mask is removed. At step 3122, a third exposed portion of the first surface of the substrate is etched. The first mask is removed at step 3124. At step 3126, a third mask is formed on the first surface of the substrate except for a portion of the first surface of the substrate corresponding to bumpstop features. At step 3128, an exposed portion of the first surface of the substrate is etched. At step 3130, the third mask is removed. At step 3132, an oxide layer is formed on the first surface of the substrate. At step 3134, optionally the oxide layer is etched to remove the oxide layer around and on the bumpstop features using a fourth mask. At step 3136, a silicon wafer is fusion bonded to a portion of the first surface of the substrate that is covered by the oxide layer. It is appreciated that in some embodiments fusion bonding a silicon wafer to a portion of the first surface of the substrate that is covered by the oxide layer after removing the fourth mask.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A method comprising:
   forming a first mask on a first portion of a first surface of a substrate;
   forming a second mask on the first mask and further forming the second mask on a second portion of the first surface of the substrate;
   etching an first exposed portion of the first surface of the substrate;
   removing the second mask;
   etching a second exposed portion of the first surface of the substrate;
   removing the first mask;
   forming an oxide layer on the first surface of the substrate;

forming a third mask on the oxide layer except for a portion of the oxide layer corresponding to bumpstop features;
removing the portion of the oxide layer corresponding to the bump stop features;
etching third exposed portion of the first surface of the substrate; and
removing the third mask.

2. The method of claim 1 further comprising:
fusion bonding a silicon wafer to a third portion of the first surface of the substrate that is covered by the oxide layer.

3. The method of claim 2 further comprising etching the silicon wafer to form an actuator.

4. The method of claim 1, wherein the first mask, the second mask and the third mask are each an oxide hard mask, a nitride hard mask, a metal hard mask, or a photo-resist mask.

5. The method of claim 1, wherein the substrate is a silicon handle wafer or a silicon-germanium wafer.

6. A method comprising:
forming a first mask on a first portion of a first surface of a substrate;
forming a second mask on a portion of the first mask and further forming the second mask on a second portion of the first surface of the substrate;
etching a first exposed portion of the first surface of the substrate;
removing a portion of the first mask not covered by the second mask;
etching a second exposed portion of the first surface of the substrate;
removing the second mask;
etching a third exposed portion of the first surface of the substrate;
removing the first mask;
forming a third mask on the first surface of the substrate except for a portion of the first surface of the substrate corresponding to bump stop features;
etching a fourth exposed portion of the first surface of the substrate;
removing the third mask; and
forming an oxide layer on the first surface of the substrate.

7. The method of claim 6 further comprising:
fusion bonding a silicon wafer to a portion of the first surface of the substrate that is covered by the oxide layer.

8. The method of claim 7, wherein the silicon wafer forms an actuator.

9. The method of claim 6, wherein the substrate is a silicon wafer or a silicon-germanium wafer.

10. The method of claim 6 further comprising:
etching the oxide layer to remove the oxide layer around and on the bumpstop features using a fourth mask.

11. The method of claim 10 further comprising:
fusion bonding a silicon wafer to a portion of the first surface of the substrate that is covered by the oxide layer after removing the fourth mask.

12. The method of claim 11, wherein each of the first mask, the second mask, the third mask, and the fourth mask are an oxide hard mask, a nitride hard mask, a metal hard mask, or a photo resist mask.

* * * * *